United States Patent
Edelstein et al.

(10) Patent No.: US 9,786,605 B1
(45) Date of Patent: Oct. 10, 2017

(54) ADVANCED THROUGH SUBSTRATE VIA METALLIZATION IN THREE DIMENSIONAL SEMICONDUCTOR INTEGRATION

(71) Applicant: International Business Machines Corporation, Armonk, NY (US)

(72) Inventors: Daniel C Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/167,500

(22) Filed: May 27, 2016

(51) Int. Cl.
| | | |
|---|---|---|
| H01L 21/60 | (2006.01) | |
| H01L 23/532 | (2006.01) | |
| H01L 23/522 | (2006.01) | |
| H01L 23/528 | (2006.01) | |
| H01L 21/768 | (2006.01) | |
| H01L 21/48 | (2006.01) | |
| H01L 23/498 | (2006.01) | |

(52) U.S. Cl.
CPC .. *H01L 23/53238* (2013.01); *H01L 21/76856* (2013.01); *H01L 21/76871* (2013.01); *H01L 21/76879* (2013.01); *H01L 21/76898* (2013.01); *H01L 23/528* (2013.01); *H01L 23/5226* (2013.01); *H01L 21/486* (2013.01); *H01L 23/49827* (2013.01)

(58) Field of Classification Search
CPC ............. H01L 21/486; H01L 23/49827; H01L 21/76898
USPC ........................................ 257/777; 438/667
See application file for complete search history.

(56) References Cited

U.S. PATENT DOCUMENTS

| | | |
|---|---|---|
| 5,891,513 A | 4/1999 | Dubin et al. |
| 6,287,977 B1 | 9/2001 | Hashim et al. |
| 6,844,258 B1 | 1/2005 | Fair et al. |
| 7,086,138 B2 | 8/2006 | Anderson |
| 7,648,899 B1 | 1/2010 | Banerji et al. |
| 8,013,446 B2 | 9/2011 | Yang et al. |
| 8,101,521 B1 * | 1/2012 | Gao .................... C23C 16/0281 257/E21.16 |
| 8,304,863 B2 | 11/2012 | Filippi |
| 8,420,531 B2 | 4/2013 | Yang et al. |
| 8,530,320 B2 | 9/2013 | Yang et al. |
| 8,962,479 B2 | 2/2015 | Yang et al. |

(Continued)

OTHER PUBLICATIONS

List of IBM Patents or Patent Applications Treated as Related.
(Continued)

*Primary Examiner* — George Fourson, III
(74) *Attorney, Agent, or Firm* — Jeffrey S LaBaw; Steven J Meyers

(57) ABSTRACT

In one aspect of the invention, a method to create an advanced through silicon via structure is described. A high aspect ratio through substrate via in a substrate is provided. The through substrate via has vertical sidewalls and a horizontal bottom. A metallic barrier layer is deposited on the sidewalls of the through substrate via. A nitridation process is performed to convert a surface portion of the metallic barrier layer to a nitride surface layer. The nitride surface layer enhances the nucleation of subsequent depositions. A metal is deposited to fill the through substrate via. Another aspect of the invention is a device created by the method.

12 Claims, 13 Drawing Sheets

(56) References Cited

U.S. PATENT DOCUMENTS

| | | | |
|---|---|---|---|
| 2004/0104481 A1 | 6/2004 | Ong | |
| 2006/0183327 A1* | 8/2006 | Moon | H01L 21/76843 438/687 |
| 2009/0321937 A1 | 12/2009 | Haneda | |
| 2010/0182041 A1 | 7/2010 | Feng | |
| 2010/0301485 A1* | 12/2010 | Sekine | H01B 3/025 257/769 |
| 2011/0241205 A1 | 10/2011 | Kirby | |
| 2011/0244676 A1 | 10/2011 | Chen | |
| 2013/0140700 A1* | 6/2013 | Ohmi | H01L 21/76898 257/751 |
| 2013/0214411 A1 | 8/2013 | Kim et al. | |
| 2014/0256153 A1* | 9/2014 | Grill | H01L 21/76283 438/762 |
| 2014/0273434 A1 | 9/2014 | Peng | |
| 2014/0329381 A1* | 11/2014 | Zhang | H01L 24/11 438/613 |
| 2015/0076694 A1* | 3/2015 | Kuo | H01L 23/147 257/751 |
| 2015/0087158 A1* | 3/2015 | Sugita | H01L 21/02118 438/761 |
| 2015/0093891 A1* | 4/2015 | Zope | H01L 21/76877 438/618 |
| 2016/0086849 A1 | 3/2016 | Gluschenkov | |
| 2016/0260674 A1* | 9/2016 | Jones | H01L 23/481 |

OTHER PUBLICATIONS

Tan et al., "Low Temperature Wafer Bonding of Low-k Carbon-Doped Oxide for Application in 3D Integration", Electrochemical and Solid-State Letters, 13 (2) H27-H29 (2010).

Ventosa et al., "Mechanism of Thermal Oxide Direct Wafer Bonding", Electrochemical and Solid-State Letters, 12 (10) H373-H375 (2009).

* cited by examiner

US 9,786,605 B1

ADVANCED THROUGH SUBSTRATE VIA METALLIZATION IN THREE DIMENSIONAL SEMICONDUCTOR INTEGRATION

BACKGROUND OF THE INVENTION

This disclosure relates to integrated circuit devices, and more specifically, to a method and structure to create advanced through silicon via structures in semiconductor devices.

As the dimensions of modern integrated circuitry in semiconductor chips continues to shrink, conventional lithography is increasingly challenged to make smaller and smaller structures. With the reduced size of the integrated circuit, packaging the chips more closely together becomes important as well. By placing chips closer to each other, the performance of the overall computer system is improved.

One approach to reduce the distance between devices is three-dimensional (3D) packaging. While reducing the dimensions of the components within the integrated circuit improves signal propagation speed, the packaging interconnects do not become faster merely because the transistors do. Three dimensional integrated circuits address the scaling challenge by stacking multiple chips and connecting them in the third dimension. In 3D packaging, there are a number of competing technologies, including package-on-package, die-to-die, die-to-wafer and flip chip. In several of these technologies, a through-substrate via (TSV), most commonly a through-silicon via, is used as a vertical electrical connection (via) passing completely through a silicon wafer or die. When TSVs are used as an interconnect to create 3D packages and 3D integrated circuits as compared to alternatives such as package-on-package, the density of the vias is substantially higher, and the length of the connections is shorter.

BRIEF SUMMARY

According to this disclosure, an advanced through silicon via structure and a method for constructing the structure are described. In one aspect of the invention, a high aspect ratio through substrate via in a substrate is provided. The through substrate via has vertical sidewalls and a horizontal bottom. A metallic barrier layer is deposited on the sidewalls of the through substrate via. A nitridation process is performed to convert a surface portion of the metallic barrier layer to a nitride surface layer. The nitride surface layer enhances the nucleation of subsequent depositions. A metal is deposited to fill the through substrate via. Another aspect of the invention is a device. The device has a substrate which including integrated circuit devices. A high aspect ratio through substrate via is provided in the substrate. The through substrate via has vertical sidewalls and a horizontal bottom. A metallic barrier layer is disposed on the sidewalls of the through substrate via. A surface portion of the metallic barrier layer has been converted to a nitride surface layer by a nitridation process. The nitride surface layer enhances the nucleation of subsequent depositions. A metal filling a portion of the through substrate via is disposed over the metallic barrier layer.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1A:
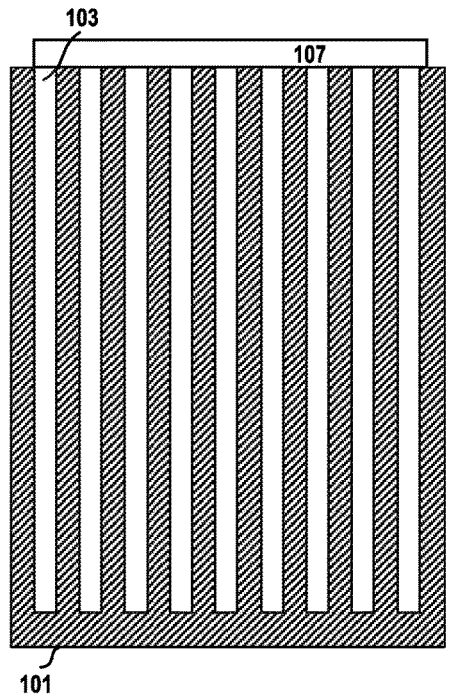
FIGS. 1A and 1B respectively illustrate a cross sectional view of a set of TSVs formed by the present invention and a cross sectional view of a set of TSVs formed by a prior art process.

At a high level, the invention includes an advanced through-silicon via and a method for fabricating the TSV structure with improved performance and yield by increasing the wettability of the sides of the via hole with a nitridation treatment. In the prior art, due to high aspect ratio of the TSV structure, metallization has been a critical challenge. The inventors have observed that this nitridation treatment enhances nucleation of the deposited metallic liner which results in better Cu metal fill quality. The plasma nitridation process enhances TSV metallization and reduces voids by more than 50% than the current processes of record.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

Figure 1B:
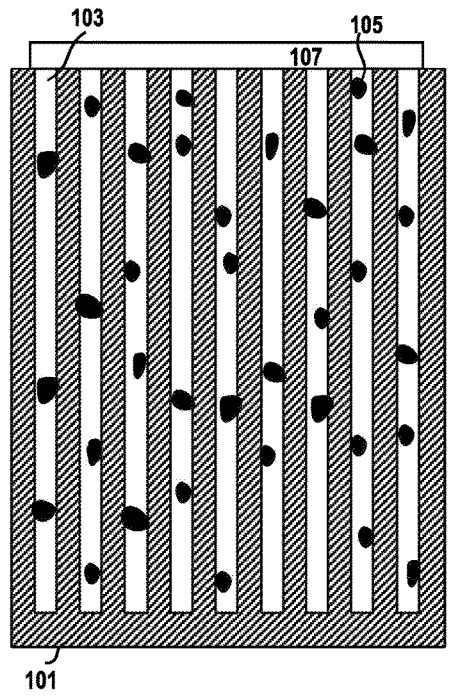

FIGS. 1A and 1B are respectively a cross sectional view of a set of TSVs formed by the present invention and a cross sectional view of a set of TSVs formed by a prior art process. As shown in FIG. 1A, a set of test TSV structures are etched in a substrate 101 and then filled with a conductor 103 by the process of the present invention. The substrate material is silicon in some embodiments of the invention. However, other embodiments use substrates comprised of different semiconductors or insulators such as SiO2 or Si3N4. In preferred embodiments, the substrate will have a thickness on the order of 1 micrometer or greater. Each TSV has a set of vertical sidewalls and a horizontal bottom. The present invention uses a nitridation treatment and a set of metallic liner depositions to achieve a satisfactory fill of the TSVs. Without the nitridation treatment, as can be seen in FIG. 1B, voids 105 develop in the metallization. These voids reduce the reliability of the interconnection between semiconductor chips. In an actual device, one semiconductor chip or wafer would be placed on top of another semiconductor chip or wafer so that the devices and contacts face each other. The TSVs would be etched through the silicon of the top chip or wafer down to a respective contact and the metallurgy at the top surface 107 would connect devices on both chips to the rest of the packaging. These figures also show the high aspect ratio (Height/width) which is often greater than 10:1. The high aspect ratio hampers the formation of good metallization in the through substrate vias.

Figure 2:
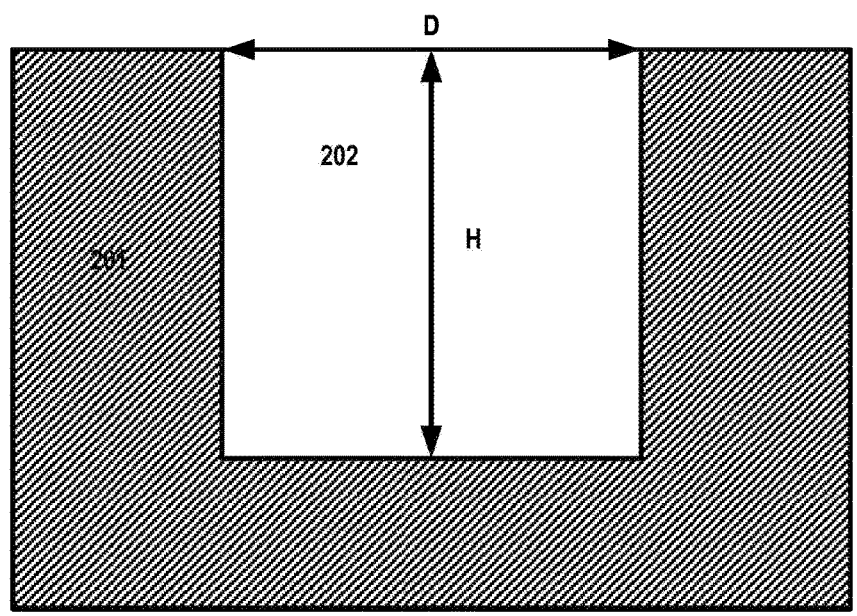
FIG. 2 is a cross-sectional diagram depicting the TSV structure after patterning and etching steps have been performed according to a first embodiment of the invention.

FIG. 2 is a cross-sectional diagram depicting the TSV structure after patterning and etching steps have been performed according to a first embodiment of the invention. As is mentioned above, the substrate 201 is silicon in preferred embodiments, however, other substrates, such as dielectric materials, are used in other embodiments of the invention. Each TSV has a set of vertical sidewalls and a horizontal bottom. For ease in illustration, the via 202 which has been etched into the substrate has a fairly even aspect ratio (H/D) of height (=H) to width (=D). However, in the actual device, there is a high aspect ratio (Height/width) which is often greater than 10:1. The height of the via 202 is the depth of the substrate to the contact metallurgy; the substrate can be thinned through a chemical mechanical polish process. A typical range of heights of the via is 1 micrometer to 500 micrometers and a typical range of width of the via is 100 nanometers to 20 micrometers.

Figure 3:
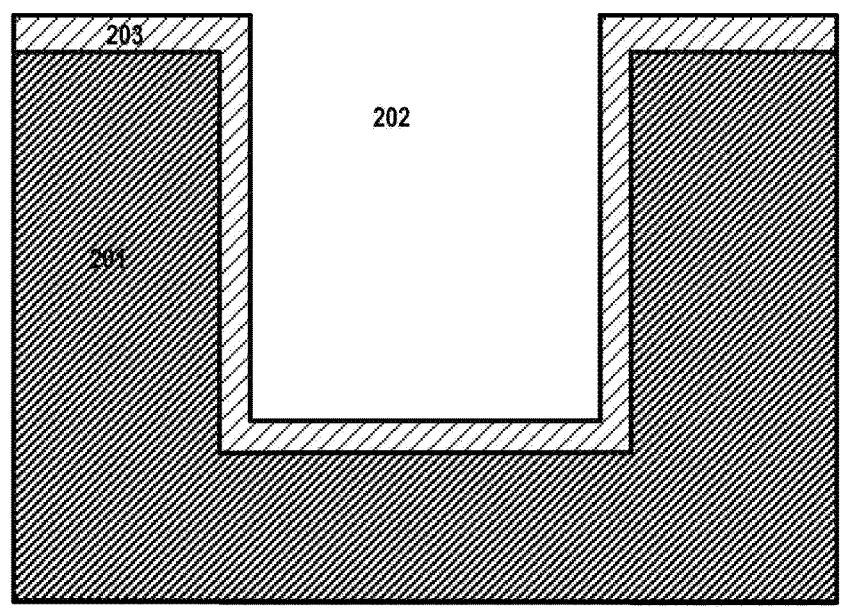
FIG. 3 is a cross-sectional diagram depicting the TSV structure after a barrier layer step has been performed according to a first embodiment of the invention.

FIG. 3 is a cross-sectional diagram depicting the TSV structure after a barrier layer step has been performed according to a first embodiment of the invention. The barrier layer 203 is deposited over the sidewalls and bottom of the substrate utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the layer 203 can vary according to the type of metal layer being formed and the technique used in forming the same. Typically, the layer 203 has a thickness from 1 nm to 20 nm, with a thickness from 2 nm to 10 nm being more typical. Suitable liner materials include Ta, Ti, W, Co, Ru, and their nitride materials, TaN, TiN, WN, CoN, RuN. The liner material 203 prevents the diffusion of the subsequent copper layer into the substrate.

Figure 4:
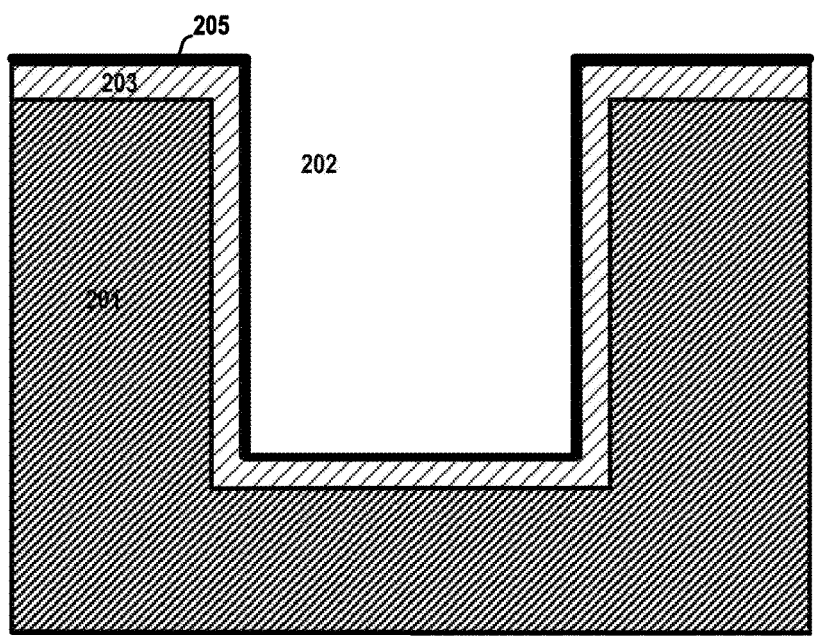
FIG. 4 is a cross-sectional diagram depicting the TSV structure after a nitridation treatment step has been performed according to a first embodiment of the invention.

FIG. 4 is a cross-sectional diagram depicting the TSV structure after a nitridation treatment step has been performed according to a first embodiment of the invention. The purpose of this step is to nitridize the surface of the deposited liner layer. A nitride layer 205 is formed in a plasma nitridation treatment over the liner material. In one embodiment, the nitridation process uses either nitrogen or ammonia, or a mixture of the two gases as a reactant. Other nitrogen containing gases can be used in other embodiments. In one embodiment of the present invention, the nitridation process is a thermal nitridation process between 100-500 degrees Celsius, preferably 100-400 degrees Celsius. In another embodiment, the nitridation process is a plasma ion nitridation process. In one embodiment, the nitride layer 205 has a thickness between 3-20 angstroms. The nitride layer that is formed is a nitride of the underlying liner layer 203. When the barrier layer is already a nitride, the surface layer of the deposited barrier layer will have a higher level/percentage of N % than the remainder of the barrier layer.

Figure 5:
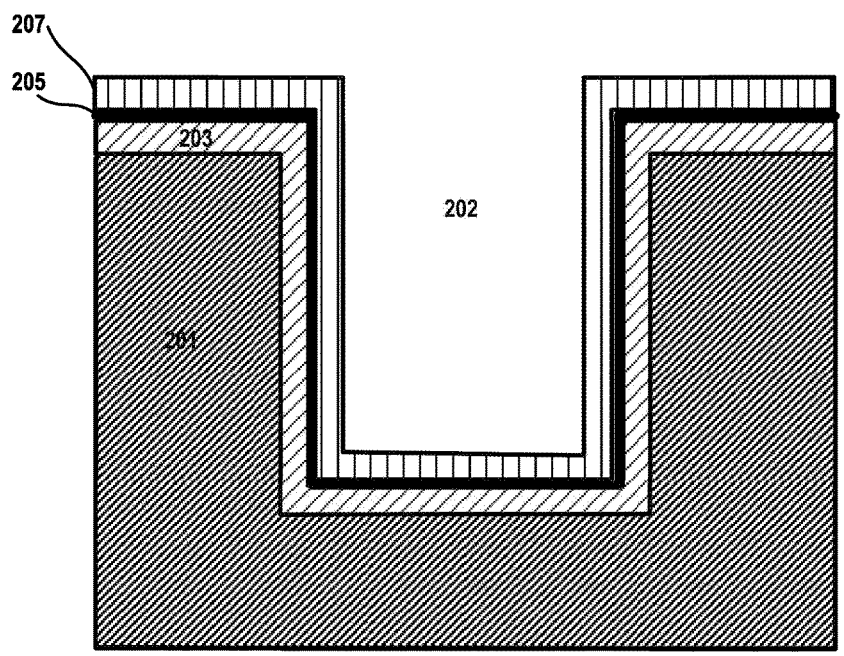
FIG. 5 is a cross-sectional diagram depicting the TSV structure after a wetting enhancement liner deposition step has been performed according to a first embodiment of the invention.

FIG. 5 is a cross-sectional diagram depicting the TSV structure after a wetting enhancement liner deposition step has been performed according to a first embodiment of the invention. The nitridation of the barrier liner 203, forming the thin nitride layer 205, enhances the nucleation of the wetting enhancement liner 207. The wetting enhancement liner 207 is deposited over the sidewalls and bottom of the TSV utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the liner can vary depending on the number of metal layers within the liner 207, the type of metal layer being formed and the technique used in forming the same. Typically, the liner 207 has a thickness from 1 nm to 20 nm, with a thickness from 2 nm to 10 nm being more typical. Suitable liner materials include W, Co, Ru and Rh. The wetting enhancement liner 207 promotes the adhesion of the subsequent copper layers into the TSV structure.

Figure 6:
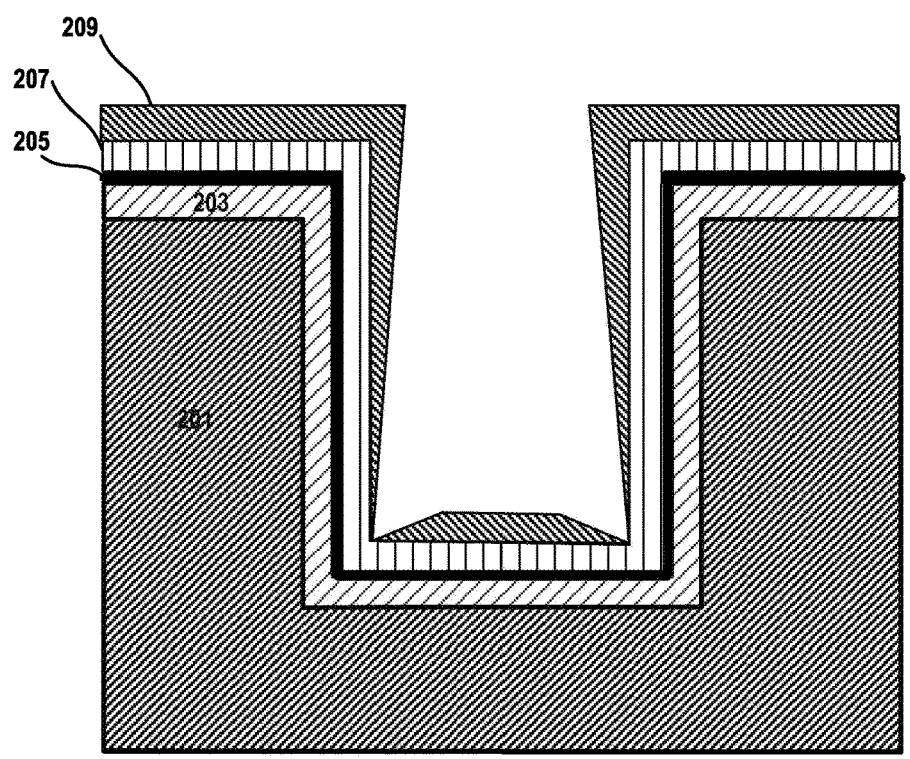
FIG. 6 is a cross-sectional diagram depicting the TSV structure after a copper seed layer step has been performed according to a first embodiment of the invention.

FIG. 6 is a cross-sectional diagram depicting the TSV structure after a copper seed layer step has been performed according to a first embodiment of the invention. The copper seed layer 209 is preferably deposited by a physical vapor deposition (PVD) process to facilitate a later electrochemical plating step. The copper deposited by the PVD process has a greater purity and adhesion to the wetting layer 207 than copper deposited by an electrochemical plating step. However, the PVD process is slow and therefore expensive compared to electroplating. The thickness of the seed layer 209 can vary depending on the process conditions. Typically, the copper seed layer 209 is relatively thin as compared to the width of the via, since the later electrochemical plating step will provide the bulk of the copper for the TSV. Embodiments of the invention have a seed layer having a thickness from 1 nm to 100 nm, with a thickness from 10 nm to 50 nm being more typical.

Figure 7:
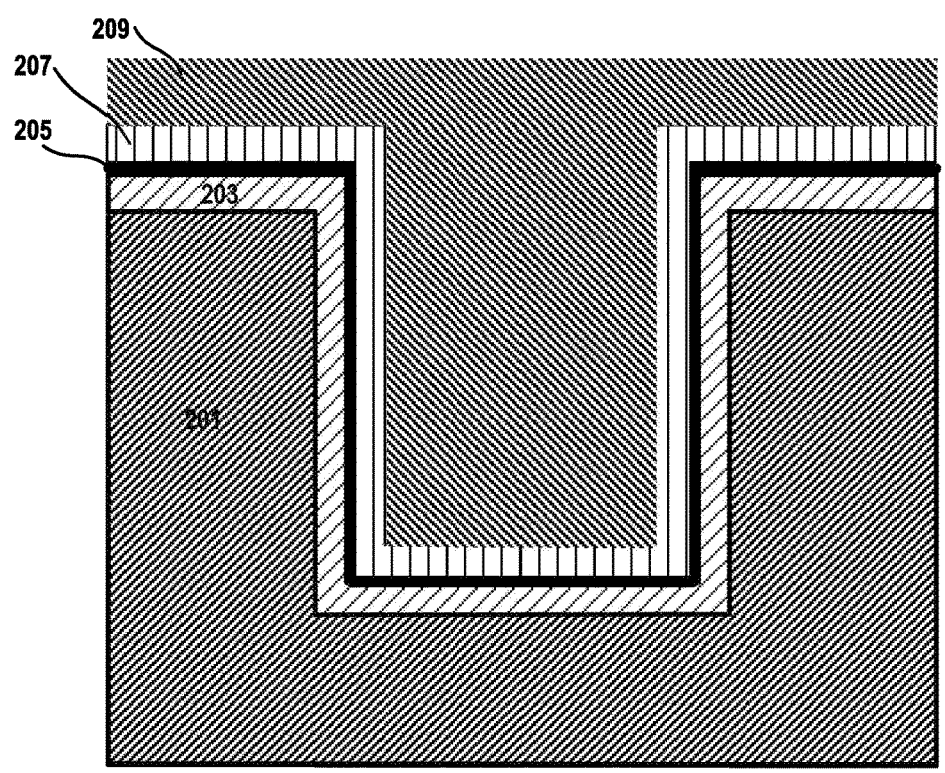
FIG. 7 is a cross-sectional diagram depicting the TSV structure after a copper deposition layer step has been performed according to a first embodiment of the invention.

FIG. 7 is a cross-sectional diagram depicting the TSV structure after a copper deposition layer step has been performed according to a first embodiment of the invention. In preferred embodiments, the bulk of the copper layer 209 is deposited in this step and is provided by an electrochemical plating step. As mentioned above, an electroplating step is less expensive than a PVD process, but lacks the adhesion properties that the PVD deposited copper possesses. However, other embodiments of the invention use other deposition technologies including PVD, ALD and CVD. Once the seed layer (shown in the figure merged into the overall copper layer) is provided, the electroplated copper has good properties to fill the remainder of the TSV. Typically, the copper layer is relatively thick and over fills the via, i.e. is an overfill layer, since a later chemical mechanical polishing step will remove the excess material from the TSV. Embodiments of the invention have an overfill copper layer having a thickness from 20 nm to 2000 nm, with a thickness from 200 nm to 800 nm being more typical.

Figure 8:
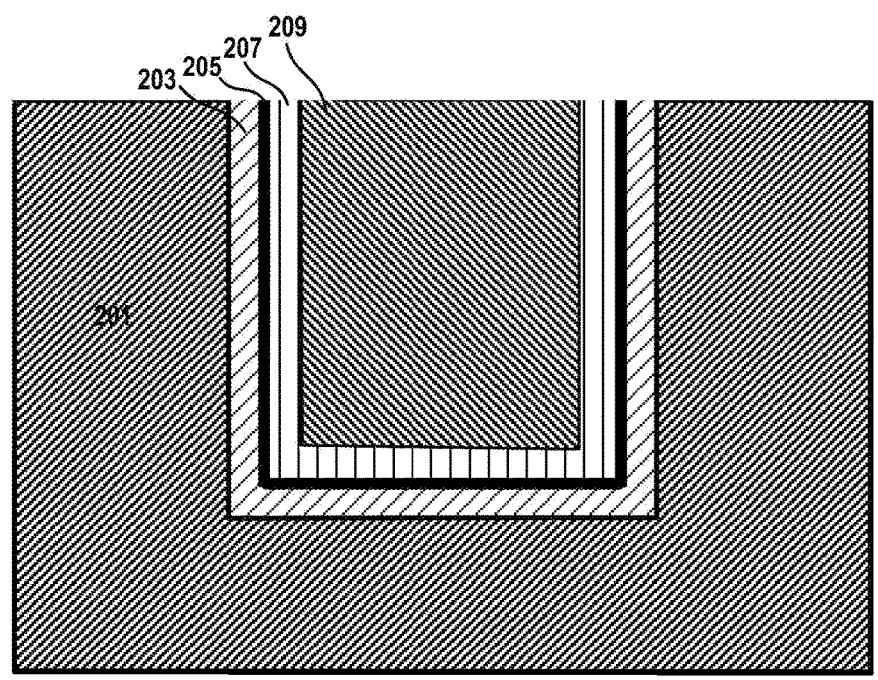
FIG. 8 is a cross-sectional diagram depicting the TSV structure after a chemical mechanical polishing step has been performed according to a first embodiment of the invention.

FIG. 8 is a cross-sectional diagram depicting the TSV structure after a chemical mechanical polishing step has been performed according to a first embodiment of the invention. The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess copper layer 209, the excess wetting enhancement liner 207, the excess nitride layer 205 and the excess liner layer 203 on areas of the substrate outside the TSVs. Other planarization processes are known to the art and are used in alternative embodiments of the invention.

Figure 9:
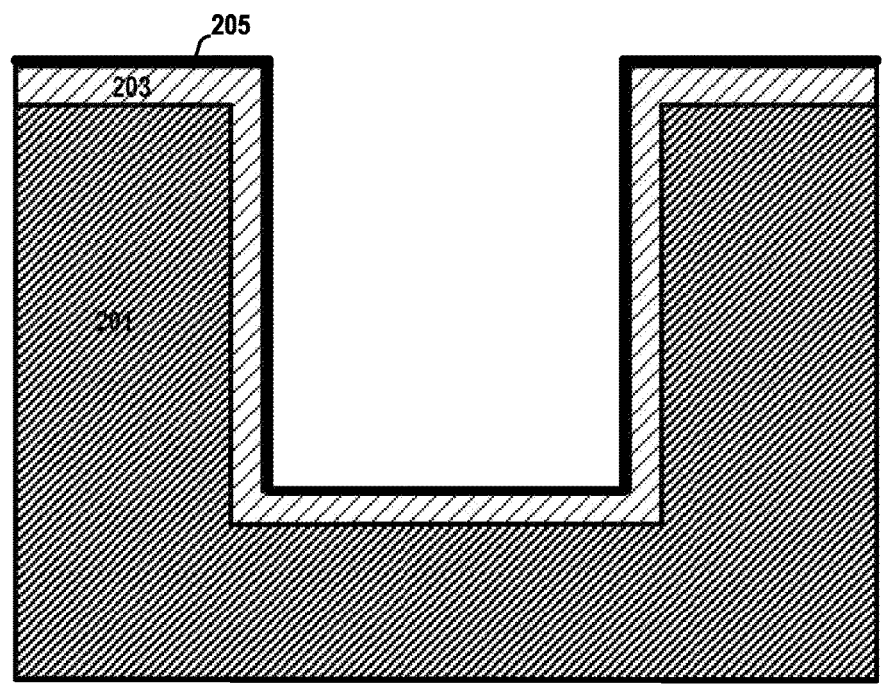
FIG. 9 is a cross-sectional diagram depicting the TSV structure after a nitridation treatment step has been performed according to a second embodiment of the invention.

FIG. 9 is a cross-sectional diagram depicting the TSV structure after a nitridation treatment step has been performed according to a second embodiment of the invention. The second embodiment of the invention creates nitride layers on either side of the wetting enhancement layer. In FIG. 9, as in the first embodiment discussed above, a nitride layer 205 is formed in a plasma nitridation treatment over the liner material. Similarly, the nitridation process is either a thermal nitridation or plasma ion nitridation process. In one embodiment, the nitride layer 205 has a thickness between 3-20 angstroms. The nitride layer 205 is to enhance deposition/nucleation of the wetting layer 207.

Figure 10:
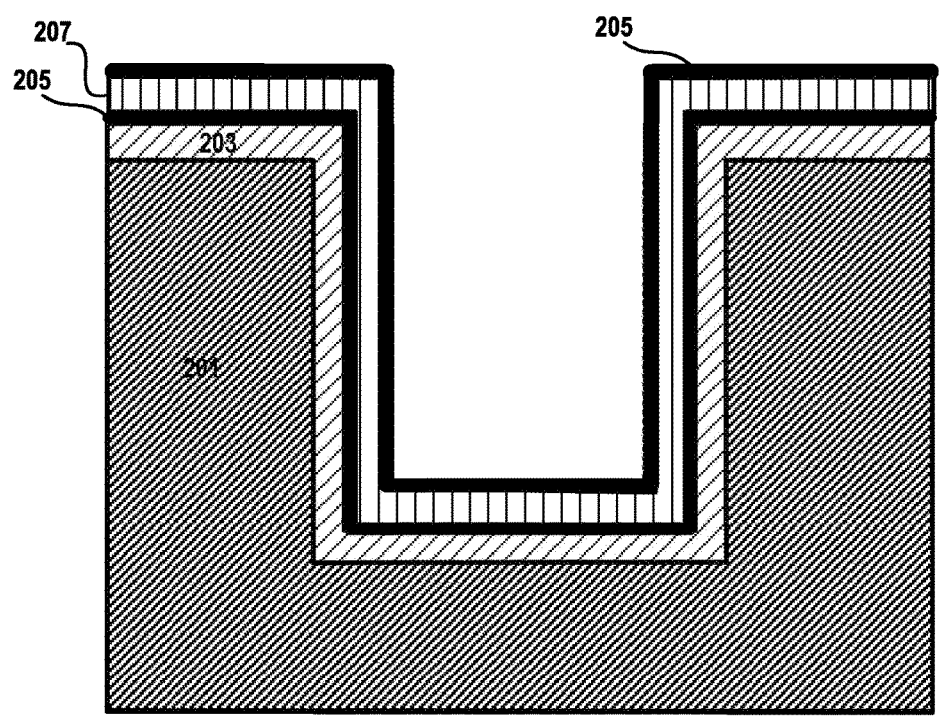
FIG. 10 is a cross-sectional diagram depicting the TSV structure after a wetting enhancement liner deposition step and a nitridation deposition step have been performed according to a second embodiment of the invention.

FIG. 10 is a cross-sectional diagram depicting the TSV structure after a wetting enhancement liner deposition step and a nitridation deposition step have been performed according to a second embodiment of the invention. As in the first embodiment, the wetting enhancement liner 207 is deposited over the sidewalls and bottom of the TSV. However, in the second embodiment, second nitride layer 205' is also formed over the wetting enhancement layer 207. The nitride layer 205' enhances the deposition and nucleation of the Cu seed layer 209.

Figure 11:
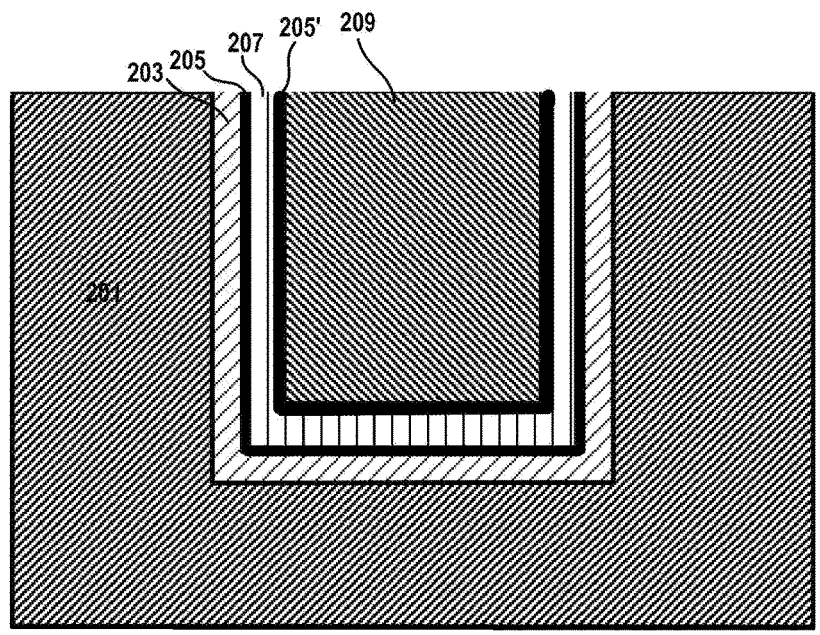
FIG. 11 is a cross-sectional diagram depicting the TSV structure after a chemical mechanical polishing step has been performed according to a second embodiment of the invention.

FIG. 11 is a cross-sectional diagram depicting the TSV structure after a chemical mechanical polishing step has been performed according to a second embodiment of the invention. The final structure of the second embodiment is shown in FIG. 11 after a planarization step.

Figure 12:
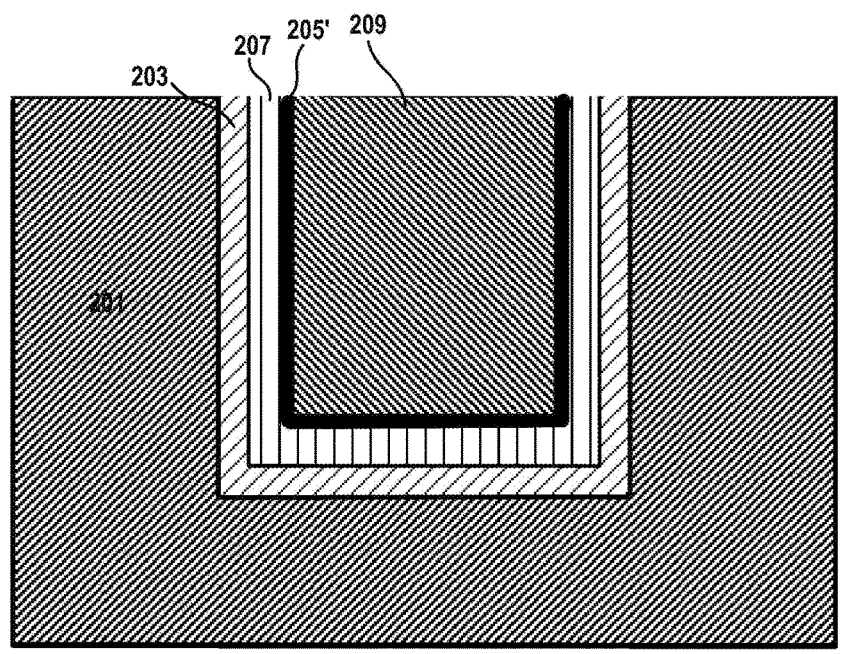
FIG. 12 depicts a cross-sectional view of a third embodiment of the invention after a planarization step.

FIG. 12 depicts a cross-sectional view of a third embodiment of the invention after a planarization step. The structure is similar to those depicted in FIGS. 8 and 11 except the structure only includes the nitride layer 205', i.e. where the nitridation treatment is only performed on the wetting layer to enhance the deposition and nucleation of the Cu seed layer 209.

Figure 13:
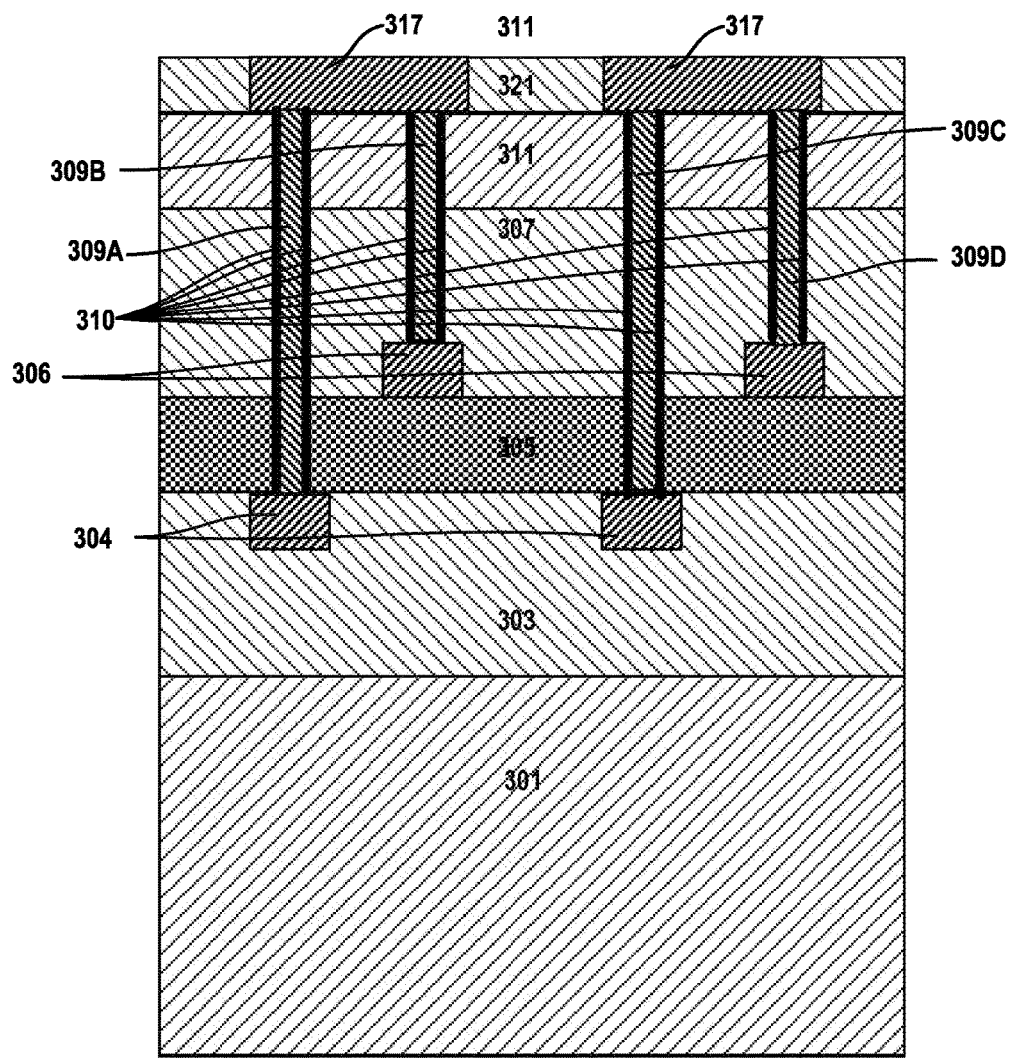
FIG. 13 is a cross-sectional diagram depicting a three dimensional integrated circuit comprising of two bonded wafers using the TSV structure of an embodiment of the invention to provide the interconnections.

FIG. 13 is a cross-sectional diagram depicting a three dimensional integrated circuit comprising of two bonded wafers using the TSV structure of an embodiment of the invention to provide the interconnections. As shown, lower wafer comprised of substrate 301, device layer 303 and contacts 304 is bonded by bonding layer 305 to upper wafer comprised of contacts 306, device layer 307 and substrate layer 311. Device layers 303 and 311 are shown in a simplified fashion for ease in illustration, but comprise the normal complement of transistors and other devices and interconnecting metallurgy. The contacts 304 and 306 are composed of a conductive material, e.g., copper, and are used to electrically interconnect the device layers to the TSVs 309A-D and the packaging metallurgy 317. The bonding layer is comprised of a silicon oxide material in preferred embodiments of the invention. The nitride and wetting layers 310 are shown as a single layer for ease in illustration, but would comprise the multiple layers as described above and shown in the preceding figures. Oxide layer 321 is deposited to protect the underlying substrate from succeeding layers of packaging metallurgy.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating a through substrate via structure comprising:
   providing a high aspect ratio through substrate via in a silicon substrate, the through substrate via having vertical silicon sidewalls and a horizontal bottom;
   depositing a metallic barrier layer on the vertical silicon sidewalls of the through substrate via;
   enhancing the nucleation of subsequent depositions by performing a nitridation process to convert a surface portion of the metallic barrier layer to a nitride nucleation enhancing surface layer;
   depositing a wetting enhancement liner layer directly over the nitride nucleation enhancing surface layer prior to filling the through substrate via with a metal;
   enhancing the nucleation of subsequent depositions by performing a nitridation process to convert a surface portion of the wetting enhancement layer to a second nitride nucleation enhancing surface layer;
   depositing the metal to fill the through substrate via; and
   wherein the metallic barrier layer is CoN and the wetting enhancement layer is Rh.

2. The method as recited in claim 1, wherein the aspect ratio is a ratio of a height of the through substrate via divided by a width of the through substrate via and the aspect ratio is greater than 10:1.

3. The method as recited in claim 1, wherein the metal layer is copper and the method further comprises:
   depositing a seed layer of copper over the second nitride nucleation enhancing surface layer;
   depositing an overfill layer of copper over the seed layer of copper; and
   performing a planarization step to remove excess copper from the overfill layer.

4. The method as recited in claim 1, wherein the nitridation process is selected from the group of a plasma nitrididation process and a thermal nitridation process.

5. The method as recited in claim 3, wherein the overfill layer of copper is produced by an electrochemical plating process.

6. The method as recited in claim 1, wherein a plurality of through silicon vias are produced, wherein a first subset of the through silicon vias electrically connect to contacts of a first integrated circuit layer and a second subset of the through silicon vias electrically connect to contacts of a second integrated circuit layer.

7. An integrated circuit device comprising:
   a substrate including integrated circuit devices;

a high aspect ratio through substrate via in the substrate, the through substrate via having vertical sidewalls and a horizontal bottom;

a metallic barrier layer on the sidewalls of the through substrate via;

a nucleation enhancing layer formed from a surface portion of the metallic barrier layer that has been converted to a nitride surface layer by a nitridation process;

a wetting enhancement layer disposed directly over the nucleation enhancing layer;

a second nucleation enhancing layer formed from a surface portion of the wetting enhancement layer that has been converted to a nitride surface layer by a nitridation process;

a metal filling a portion of the through substrate via disposed over the second nucleation enhancing layer; and wherein the metallic barrier layer is CoN and the wetting enhancement layer is Rh.

8. The device as recited in claim 7, wherein the metal is copper and the copper is deposited as a seed layer of copper over the second nitride surface layer and an overfill layer of copper over the seed layer of copper.

9. The device as recited in claim 7, wherein the aspect ratio is a ratio of a height of the through substrate via divided by a width of the through substrate via and the aspect ratio is greater than 10:1.

10. The device as recited in claim 7, wherein a plurality of through silicon vias are produced, wherein a first subset of the through silicon vias electrically connect to contacts of a first integrated circuit layer and a second subset of the through silicon vias electrically connect to contacts of a second integrated circuit layer.

11. An integrated circuit device comprising:

a substrate including integrated circuit devices, the substrate comprised of a silicon material;

a high aspect ratio through substrate via in the substrate, the through substrate via having vertical sidewalls and a horizontal bottom, the vertical sidewalls comprised of the silicon material;

a metallic barrier layer disposed in contact on the vertical sidewalls of the through substrate via;

a first nucleation enhancing layer formed from a surface portion of the metallic barrier layer that has been converted to a nitride surface layer by a nitridation process;

a wetting enhancement liner layer disposed on the metallic barrier layer;

a second nucleation enhancing layer formed from a surface portion of the wetting enhancement liner has been converted to a nitride surface by a nitridation process; and a metal layer filling a portion of the through substrate via disposed over the metallic barrier layer;

wherein the metallic barrier layer is CoN and the wetting enhancement layer is Rh.

12. The device as recited in claim 7, wherein the substrate is silicon and the metallic barrier layer is deposited in direct contact with the silicon substrate.

* * * * *